(12) United States Patent
Chou

(10) Patent No.: US 6,344,284 B1
(45) Date of Patent: Feb. 5, 2002

(54) ORGANIC ELECTROLUMINESCENT MATERIALS AND DEVICES MADE FROM SUCH MATERIALS

(75) Inventor: Homer Z. Chou, Schaumburg, IL (US)

(73) Assignee: Organic Display Technology, Chicago, IL (US)

( * ) Notice: Subject to any disclaimer, the term of this patent is extended or adjusted under 35 U.S.C. 154(b) by 0 days.

(21) Appl. No.: 09/172,843

(22) Filed: Oct. 15, 1998

Related U.S. Application Data (60) Provisional application No. 60/081,277, filed on Apr. 10, 1998.

(51) Int. Cl.$^7$ .................. H05B 33/14; C09K 11/06; C08G 77/00
(52) U.S. Cl. .................. 428/690; 428/447; 428/448; 428/917; 313/504; 257/40; 257/103; 252/301.35; 528/33; 528/40
(58) Field of Search .................. 428/690, 917, 428/447, 448, 450; 313/504, 506; 257/40, 103; 528/33, 40, 43; 252/301.35

(56) References Cited

U.S. PATENT DOCUMENTS

| | | | | |
|---|---|---|---|---|
| 4,595,599 A | * | 6/1986 | Brown et al. | 427/5 |
| 5,281,489 A | * | 1/1994 | Mori et al. | 428/690 |
| 5,674,635 A | * | 10/1997 | Hsieh et al. | 428/690 |
| 5,834,100 A | * | 11/1998 | Marks et al. | 428/209 |
| 6,059,553 A | * | 5/2000 | Jin et al. | 421/387 |

FOREIGN PATENT DOCUMENTS

WO    WO 94/15368    *   7/1994

OTHER PUBLICATIONS

Robert J. P. Corriu et al., "Preparation and optical properties of hybrid sol–gel systems containing doubly anchored oligoarylenevinylenes", Chem. Commun., 1996, pp. 1845–1846. (No month).*

* cited by examiner

*Primary Examiner*—Marie Yamnitzky
(74) *Attorney, Agent, or Firm*—Wallenstein & Wagner, Ltd.

(57) ABSTRACT

Organic electroluminescent materials having desirable efficiency, weight, and durability properties, as well as devices made from such materials. In one aspect, an organic electroluminescent material is electroluminescently conductively coupled directly with an anode and cathode such that the organic electroluminescent material emits light upon the application of a voltage across the anode and cathode. The organic electroluminescent material includes an organo-siloxane polymer having a main chain comprising anthracene and/or pentacene. The anthracene or pentacene can be substituted optionally with hydrogen, alkyl, aryl, heteroalkyl, heteroaralkyl, nitro, cyano, hydroxy, alkoxy, aryloxy, thio, alkylthio, arylthio, amino, halogen, dialkylamino, diarylamino, diaralkylamino, arylamino, alkylamino, arylalkylamino, carbonyloxy, carbonylalkoxy, carbonylalkyloxy, alkylcarbonyloxy, arylcarbonyloxy, alkoxylcarbonyloxy, sulfonyl, sulfonyloxy, alkyl bonded to the adjacent silicon atom of the organo-siloxane polymer, aryl bonded to the adjacent silicon atom of the organo-siloxane polymer, or the adjacent silicon atom of said organo-siloxane polymer.

49 Claims, 4 Drawing Sheets

ORGANIC ELECTROLUMINESCENT MATERIALS AND DEVICES MADE FROM SUCH MATERIALS

1 CROSS REFERENCE TO RELATED U.S. PATENT APPLICATIONS

This application claims priority from provisional U.S. patent application Ser. No. 60/081,277, entitled Organic Electroluminescent Device, by Homer Chou, filed Apr. 10, 1998.

2 BACKGROUND OF THE INVENTION

2.1 Field of the Invention

The present invention relates to light-emitting materials and devices constructed using such materials. More specifically, the present invention relates to organic, electroluminescent materials and associated devices. The present invention has applications in the areas of materials science, organic chemistry, and electronics.

2.2 The Related Art

Makers of electronic devices that produce visual information, such as computers, are working intensely to develop display devices that provide brighter, sharper pictures at lower manufacturing cost and less weight. The drive to lighter, cheaper, better displays has lead to the development of flat-panel displays ("FPDs") that are commonly used in laptop computers and include a growing share of the desktop computer display market. FPDs are almost exclusively liquid crystal displays ("LCDs"). However, LCD technology has shortcomings, including weak brightness and large power requirements.

Figure 1:
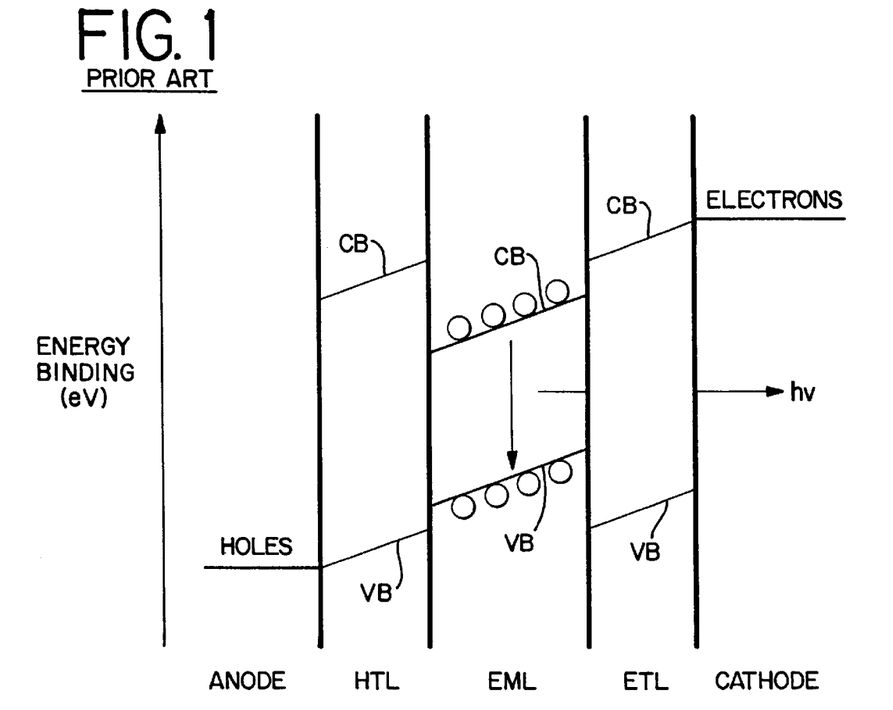
FIG. 1 is a schematic of the electronic energy levels for an electroluminescent device comprising an anode, a hole transport layer ("HTL"), an electroluminescent layer ("EML"), and electron transport layer ("ETL"), and a cathode. Also shown are the conduction bands ("CB") and valence bands ("VB") of the materials. The filled circles represent LUMOs (lowest unoccupied molecular orbitals); the empty circles represent HOMOs (highest occupied molecular oribitals).

One alternative to LCDs are electroluminescent ("EL") displays. EL displays use the luminescense of a solid film that is produced when a voltage is applied to the solid film. Referring to FIG. 1, which illustrates the process generally, the electroluminescent material ("EML") is placed between a cathode and an anode. The application of an electric potential (typically ~100 MV/m) injects holes into the highest occupied molecular orbital ("HOMO") or valence band ("VB") of the EML from the anode, and electrons are injected into the lowest unoccupied molecular orbital ("LUMO") of the EML or conduction band ("CB"). The recombination of the electrons and holes in the EML causes the emission of light from EML.

Figure 2:
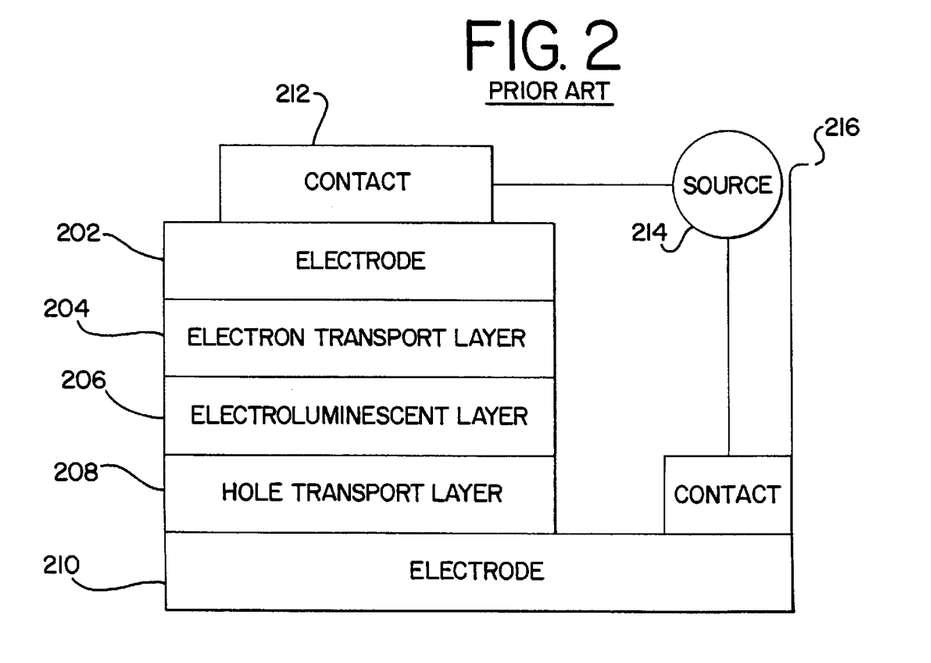
FIG. 2 is a schematic of an electroluminescent device according to the prior art that is consistent with the energy diagram illustrated in FIG. 1.

To facilitate the production of holes and electrons, a hole transport layer ("HTL") and/or electron transport layer ("ETL") are provided to increase the efficiency of hole (electron) injection and recombination. This has lead to the design of EL displays having the general structure shown in FIG. 2 at 200. There, an electrode 202 is coupled with an electron transport layer 204. ETL 204 is coupled with electroluminescent layer 206, which, in turn, is coupled with hole transport layer 208. HTL 208 is coupled with electrode 210. Electrodes 202 and 210 are connected by contacts 212 and 214 that are each coupled to a source 216.

Presently, EL displays are fabricated using either inorganic materials, such as manganese (Mn)-doped zinc sulfide (ZnS), or organic materials such as polyphenylene vinylene ("PPV") and its derivatives. However, no satisfactory EL material has been developed for widespread applications. Although inorganic EL displays can provide high performance and durability, they suffer from large power requirements and expensive, low-throughput fabrication processes. Thus, inorganic EL displays have been relegated largely to niche applications, such as military and medical applications. Organic EL displays, on the other hand, can be fabricated more cheaply and simply than inorganic EL displays, but suffer from relatively poor performance.

Thus, a need remains to provide an EL display having a cost/performance profile that is suitable for the general marketplace. Such a device will require materials that are relatively inexpensive and simple to prepare compared to inorganic EL displays while providing comparable performance characteristics. The present invention meets these and other needs.

3 SUMMARY OF THE INVENTION

The present invention provides organic electroluminescent materials having desirable efficiency, weight, and durability properties, as well as devices made from such materials. The materials provided by the present invention are relatively straightforward to make, thereby being economically attractive. In addition, the light-emitting organic materials of the invention have been found to have performance characteristics comparable to inorganic light-emitting devices. Thus, the organic electroluminescent materials and devices of the invention will be appreciated by those of skill in the materials and electronics arts to address important needs in those fields.

In a first aspect, the present invention provides an electroluminescent device. The device of the invention includes, in one embodiment, an anode and a cathode. An organic electroluminescent material is electroluminescently conductively coupled directly with the anode and cathode such that the organic electroluminescent material emits light upon the application of a voltage across the anode and cathode. The organic electroluminescent material includes an organo-siloxane polymer. The main chain of the organo-siloxane polymer comprises an anthracene or pentacene organic component, the anthracene or pentacene being present either individually or in combination. The anthracene or pentacene can be substituted optionally with hydrogen, alkyl, aryl, heteroalkyl, heteroaralkyl, nitro, cyano, hydroxy, alkoxy, aryloxy, thio, alkythio, arylthio, amino, halogen, dialkylamino, diarylamino, diaralkylamino, arylamino, alkylamino, arylalkylamino, carbonyloxy, carbonylalkoxy, carbonylalkyloxy, alkylcarbonyloxy, arylcarbonyloxy, alkoxylcarbonyloxy, sulfonyl, sulfonyloxy, alkyl bonded to the adjacent silicon atom of the organo-siloxane polymer, aryl bonded to the adjacent silicon atom of the organo-siloxane polymer, or the adjacent silicon atom of said organo-siloxane polymer.

In a more specific embodiment, the organic component comprises anthracene. In a still more specific embodiment, the anthracene is coupled with a silicon atom in the main chain of the organo-siloxane polymer by at least one alkyl group. In one embodiment, the alkyl group has the formula —$CH_2(CH_2)_m CH_2$—, where m is an integer between 1 and 4. In another more specific embodiment, the anthracene is coupled with the main chain of the organo-siloxane polymer by two such alkyl groups. The alkyl groups can be situated at two symmetric positions on the anthracene. A specific example of one such substituted anthracene is that for which m is 1 and the alkyl groups are located at the opposing central carbon atoms of the anthracene molecule: 9,10-bis(trimethylene)anthracene:

In another embodiment, the organic component comprises pentacene. In a still more specific embodiment, the pentacene is coupled with a silicon atom in the main chain of the organo-siloxane polymer by at least one alkyl group. In one embodiment, the alkyl group has the formula —$CH_2(CH_2)_mCH_2$—, where m is an integer between 1 and 4. In another more specific embodiment, the pentacene is coupled with the main chain of the organo-siloxane polymer by two such alkyl groups, which alkyl groups can be situated at symmetric positions on the carbon ring system. A specific example of one such substituted pentacene is that for which m is 1: 6,13-bis(trimethylene)pentacene:

The electroluminescent material can further include a dopant, such as an electron transport material, a hole transport material, or a dye. The electron transport material, a hole transport material, or dye can be combined individually or in combination. In one embodiment, the hole transport material can be, without limitation, a porphyrin or aromatic tertiary amine. In another embodiment, the dye can be, without limitation, coumarin, a rhodamine salt (e.g., rhodamine perchlorate), or perylene. In still another embodiment, the organo-siloxane polymer is cross-linked with oxygen atoms.

In another aspect, the invention provides an organic electroluminescent material comprising an organo-siloxane polymer in combination with an electron transport material, a hole transport material, or a dye. The electron transport material, hole transport material, or dye can be combined with the organo-siloxane polymer individually or in combination. The organic component of the organo-siloxane polymer includes anthracene or pentacene, individually or in combination. The anthracene or pentacene can be substituted optionally with hydrogen, alkyl, aryl, heteroalkyl, heteroaralkyl, nitro, cyano, hydroxy, alkoxy, aryloxy, thio, alkythio, arylthio, amino, halogen, dialkylamino, diarylamino, diaralkylamino, arylamino, alkylamino, arylalkylamino, carbonyloxy, carbonylalkoxy, carbonylalkyloxy, alkylcarbonyloxy, arylcarbonyloxy, alkoxylcarbonyloxy, sulfonyl, sulfonyloxy, alkyl bonded to the adjacent silicon atom of the organo-siloxane polymer, aryl bonded to the adjacent silicon atom of the organo-siloxane polymer, or the adjacent silicon atom of said organo-siloxane polymer.

In a more specific embodiment, the organic component comprises anthracene. In a still more specific embodiment, the anthracene is coupled with a silicon atom in the main chain of the organo-siloxane polymer by at least one alkyl group. In one embodiment, the alkyl group has the formula —$CH_2(CH_2)_mCH_2$—, where m is an integer between 1 and 4. In another more specific embodiment, the anthracene is coupled with the main chain of the organo-siloxane polymer by two such alkyl groups. The alkyl groups can be situated at two symmetric positions on the anthracene. A specific example of one such substituted anthracene is that for which m is 1 and the alkyl groups are located at the opposing central carbon atoms of the anthracene molecule: 9,10-bis(trimethylene)anthracene.

In another embodiment, the organic component comprises pentacene. In a still more specific embodiment, the pentacene is coupled with a silicon atom in the main chain of the organo-siloxane polymer by at least one alkyl group. In one embodiment, the alkyl group has the formula —$CH_2(CH_2)_mCH_2$—, where m is an integer between 1 and 4. In another more specific embodiment, the pentacene is coupled with the main chain of the organo-siloxane polymer by two such alkyl groups, which alkyl groups can be situated at symmetric positions on the carbon ring system. A specific example is 6,13-bis(trimethylene)pentacene.

In one embodiment, a hole transport material is included with the organic electroluminescent material. In one embodiment, the hole transport material can be, without limitation, a porphyrin or aromatic tertiary amine. In another embodiment, a dye in included with the organic electroluminescent material is a dye. The dye can be, without limitation, coumarin, a rhodamine salt (e.g., rhodamine perchlorate), or perylene. In still another embodiment, the organo-siloxane polymer is cross-linked with oxygen atoms.

In another aspect, the present invention provides an organo-siloxane polymer having a main chain including silicon, oxygen, and an organic component selected from anthracene and/or pentacene. The anthracene or pentacene can be substituted optionally with hydrogen, alkyl, aryl, heteroalkyl, heteroaralkyl, nitro, cyano, hydroxy, alkoxy, aryloxy, thio, alkythio, arylthio, amino, halogen, dialkylamino, diarylamino, diaralkylamino, arylamino, alkylamino, arylalkylamino, carbonyloxy, carbonylalkoxy, carbonylalkyloxy, alkylcarbonyloxy, arylcarbonyloxy, alkoxylcarbonyloxy, sulfonyl, sulfonyloxy, alkyl bonded to the adjacent silicon atom of the organo-siloxane polymer, aryl bonded to the adjacent silicon atom of the organo-siloxane polymer, or the adjacent silicon atom of said organo-siloxane polymer.

In a more specific embodiment, the organic component comprises anthracene. In a still more specific embodiment, the anthracene is coupled with a silicon atom in the main chain of the organo-siloxane polymer by at least one alkyl group. In one embodiment, the alkyl group has the formula —$CH_2(CH_2)_mCH_2$—, where m is an integer between 1 and 4. In another more specific embodiment, the anthracene is coupled with the main chain of the organo-siloxane polymer by two such alkyl groups. The alkyl groups can be situated at two symmetric positions on the anthracene. A specific example of one such substituted anthracene is that for which m is 1 and the alkyl groups are located at the opposing central carbon atoms of the anthracene molecule: 9,10-bis(trimethylene)anthracene.

In another embodiment, the organic component comprises pentacene. In a still more specific embodiment, the pentacene is coupled with a silicon atom in the main chain of the organo-siloxane polymer by at least one alkyl group. In one embodiment, the alkyl group has the formula —$CH_2(CH_2)_mCH_2$—, where m is an integer between 1 and 4. In another more specific embodiment, the pentacene is coupled with the main chain of the organo-siloxane polymer by two such alkyl groups, which alkyl groups can be situated at symmetric positions on the carbon ring system. A specific example is 6,13-bis(trimethylene)pentacene.

In still another aspect, the present invention provides a method for fabricating an electroluminescent device in which an anode and a cathode are provided. The anode and cathode are coupled with an organic electroluminescent material that includes silicon-oxygen bonds under conditions effective to allow direct, electroluminescent conduction among the organic electroluminescent material, anode, and cathode such that the organic electroluminescent material emits light upon application of a voltage across the anode and cathode.

These and other aspects and advantages will become apparent when the Description below is read in conjunction with the accompanying Drawings.

4 BRIEF DESCRIPTION OF THE DRAWINGS

FIG. 5A and FIG. 5B are schematics describing the formation of various siloxane networks in accordance with the present invention.

5 DESCRIPTION OF SOME EMBODIMENTS OF THE INVENTION

The present invention provides organic electroluminescent materials having desirable efficiency, weight, and durability properties, as well as devices made from such materials. The materials provided by the present invention are relatively straightforward to make, thereby being economically attractive. These beneficial results are achieved in some embodiments in which a single electroluminescent conductive layer replaces the multiplicity of layers used by the prior art. Thus, the organic electroluminescent materials and devices of the invention will be appreciated by those of skill in the materials and electronics arts to address important needs in those fields.

5.1 Definitions

The following terms will be understood as defined in this Section 5.1 unless noted otherwise.

5.1.1 Electroluminescent Material

A material that emits photons under the application of an electric potential.

5.1.2 Electroluminescent Article

A device including at least an anode, a cathode, and an electroluminescent material arranged between the anode and cathode.

5.1.3 Conducting Material

A material that allows the passage of electrons under the application of an electric potential of less than about 10 volts/micrometer (V/$\mu$m).

5.1.4 Electroluminescently Conductively Coupled Directly

The phrase "electroluminescently conductively coupled directly" as used herein means an arrangement of an electrode and an electroluminescent material in which electrons move from the electrode to a electroluminescent material without traversing an unenhanced hole transport material or unenhanced electron transport material (as defined with respect to Sections 5.1.5–5.1.8 hereinbelow) that is arranged between the electroluminescent material and the electrode.

5.1.5 Hole Transport Layer ("HTL")

A "hole transport layer" ("HTL") is a material that stabilizes the formation of radical cations in an electroluminescent article containing a certain electroluminescent material relative to the same electroluminescent article lacking such a material. Examples of hole transport layers include, without limitation, substituted and unsubstituted phthalocyanic and porphyrinic compounds such as described in U.S. Pat. No. 5,409,783, which is incorporated herein by reference, such as silicon phthalocyanine dichloride and 5,10,14,20-tetraphenyl-21H,23H-porphine silicon (IV) dichloride. Other examples of HTLs include, without limitation, tertiary aromatic amines such as those described in U.S. Pat. Nos. 3,180,730; 3,567,450; and 3,658,520 (each of which incorporated herein by reference); as well as the above-incorporated U.S. Pat. No. 5,409,783.

5.1.6 Enhanced Hole Transport Layer

An "enhanced hole transport layer" is defined herein to mean a hole transport layer as defined in Section 5.1.5 that further includes at least one additional component that increases the performance of the electroluminescent article relative to an electroluminescent article lacking an enhanced hole transport layer as measured by performance characteristics including, but not limited to, threshold turn-on voltage, luminosity (brightness), article lifetime, emission wavelength(s).

5.1.7 Electron Transport Layer ("ETL")

An "electron transport layer" ("ETL") is a material that stabilizes the formation of radical anions in an electroluminescent article containing a certain electroluminescent material relative to the same electroluminescent article lacking such a material. Exemplary ETL materials include, without limitation, substituted oxazoles, isoxazoles, thiazoles, isothiazoles, oxadiazoles, and thiadiazoles, such as those described in U.S. Pat. No. 5,276,381, which is incorporated herein by reference.

5.1.8 Enhanced Electron Transport Layer

An "enhanced electron transport layer" is an electron transport layer as defined in Section 5.1.7 that further includes at least one additional component that increases the performance of the electroluminescent article relative to an electroluminescent article lacking an enhanced electron transport layer as measured by performance characteristics including, but not limited to, threshold turn-on voltage, luminosity (brightness), article lifetime, emission wavelength(s).

5.1.9 Alkyl

The term "alkyl" as used herein refers to a straight, branched, or cyclic hydrocarbon chain fragment or radical containing between about one and about twenty carbon atoms, more preferably between about one and about ten carbon atoms (e.g., methyl, ethyl, n-propyl, iso-propyl, cyclopropyl, n-butyl, iso-butyl, tert-butyl, cyclobutyl, adamantyl, noradamantyl and the like). Straight, branched, or cyclic hydrocarbon chains having eight or fewer carbon atoms will also be referred to herein as "lower alkyl". The hydrocarbon chains may further include one or more degrees of unsaturation, i.e., one or more double or triple bonds (e.g., vinyl, propargyl, allyl, 2-buten-1-yl, 2-cyclopenten-1-yl, 1,3-cyclohexadien-1-yl, 3-cyclohexen-1-yl and the like). Alkyl groups containing double bonds such as just described will also be referred to herein as "alkenes". Similarly, alkyl groups having triple bonds will also be referred to herein as "alkynes". However, as used in context with respect to cyclic alkyl groups, the combinations of double and/or triple bonds do not include those bonding arrangements that render the cyclic hydrocarbon chain aromatic.

In addition, the term "alkyl" as used herein further includes one or more substitutions at one or more carbon atoms of the hydrocarbon fragment or radical. Such substitutions include, but are not limited to: aryl; heterocycle; halogen (to form, e.g., trifluoromethyl, —$CF_3$); nitro (—$NO_2$); cyano (—CN); hydroxyl (also referred to herein as "hydroxy"), alkoxyl (also referred herein as alkoxy) or aryloxyl (also referred to herein as "aryloxy", —OR); thio or mercapto, alkyl, or arylthio (—SR); amino, alkylamino, arylamino, dialkyl- or diarylamino, or arylalkylamino (—NRR'); aminocarbonyl, alkylaminocarbonyl, arylaminocarbonyl, dialkylaminocarbonyl, diarylaminocarbonyl or arylalkylaminocarbonyl (—C(O)NRR'); carboxyl, or alkyl- or aryloxycarbonyl (—C(O)OR); carboxaldehyde, or aryl- or alkylcarbonyl (—C(O)R); iminyl, aryl- or alkyliminyl (—C(=NR)R'); sulfo (—$SO_2$OR); alkyl- or arylsulfonyl (—$SO_2$R); carbamido (—HNC(=O)NRR'); or thiocarbamido (—HNC(=S)NRR'); trihalosilyl ($X_3$Si—, where X is halogen as defined herein); trialkoxysilyl (($RO_3$Si—)); where R and R' independently are hydrogen, aryl or alkyl as defined herein. Substituents including heterocyclic groups (i.e., heterocycle, heteroaryl, and heteroaralkyl) are defined by analogy to the above-described terms. For example, the term "heterocycleoxy" refers to the group —OR, where R is heterocycle as defined below.

5.1.10 Carbonyl

The term "carbonyl" as used herein refers to the functional group —C(O)—. However, it will be appreciated that this group may be replaced with well-known groups that have similar electronic and/or steric character, such as thiocarbonyl (—C(S)—); sulfinyl (—S(O)—); sulfonyl (—$SO_2$—); phosphonyl (—$PO_2$—), and methylene (—C($CH_2$)—). Other carbonyl equivalents will be familiar to those having skill in the medicinal and organic chemical arts.

5.1.11 Aryl

The term "aryl" as used herein refers to cyclic aromatic hydrocarbon chains having twenty or fewer carbon atoms, e.g., phenyl, naphthyl, biphenyl and anthracenyl. One or more carbon atoms of the aryl group may also be substituted with, e.g.,: alkyl; aryl; heterocycle; halogen; nitro; cyano; hydroxyl, alkoxyl or aryloxyl; thio or mercapto, alkyl-, or arylthio; amino, alkylamino, arylamino, dialkyl-, diaryl-, or arylalkylamino; aminocarbonyl, alkylaminocarbonyl, arylaminocarbonyl, dialkylaminocarbonyl, diarylaminocarbonyl or arylalkylaminocarbonyl; carboxyl, or alkyl- or aryloxycarbonyl; carboxaldehyde, or aryl- or alkylcarbonyl; iminyl, or aryl- or alkyliminyl; sulfo; alkyl- or arylsulfonyl; hydroximinyl, or aryl- or alkoximinyl; carbamido; or thiocarbamido. In addition, two or more alkyl or heteroalkyl substituents of an aryl group may be combined to form fused aryl-alkyl or aryl-heteroalkyl ring systems (e.g., tetrahydronaphthyl). Substituents including heterocyclic groups (e.g., heterocycleoxy, heteroaryloxy, and heteroaralkylthio) are defined by analogy to the above-described terms.

5.1.12 Aralkyl

The term "aralkyl" as used herein refers to an aryl group that is joined to a parent structure by an alkyl group as described above, e.g., benzyl, α-methylbenzyl, phenethyl, and the like.

5.1.13 Heterocycle

The term "heterocycle" as used herein refers to a cyclic alkyl group or aryl group as defined above in which one or more carbon atoms have been replaced by a non-carbon atom, especially nitrogen, oxygen, or sulfur. Non-aromatic heterocycles will also be referred to herein as "cyclic heteroalkyl". Aromatic heterocycles are also referred to herein as "heteroaryl". For example, such groups include furyl, tetrahydrofuryl, pyrrolyl, pyrrolidinyl, thienyl, tetrahydrothienyl, oxazolyl, isoxazolyl, triazolyl, thiazolyl, isothiazolyl, pyrazolyl, pyrazolidinyl, oxadiazolyl, thiadiazolyl, imidazolyl, imidazolinyl, pyridyl, pyridazinyl, triazinyl, piperidinyl, morpholinyl, thiomorpholinyl, pyrazinyl, piperazinyl, pyrimidinyl, naphthyridinyl, benzofuranyl, benzothienyl, indolyl, indolinyl, indolizinyl, indazolyl, quinolizinyl, quinolinyl, isoquinolinyl, cinnolinyl, phthalazinyl, quinazolinyl, quinoxalinyl, pteridinyl, quinuclidinyl, carbazolyl, acridiniyl, phenazinyl, phenothiazinyl, phenoxazinyl, purinyl, benzimidazolyl, benzthiazolyl, and benzoxazolyl.

The above heterocyclic groups may further include one or more substituents at one or more carbon and/or non-carbon atoms of the heteroaryl group, e.g.: alkyl; aryl; heterocycle; halogen; nitro; cyano; hydroxyl, alkoxyl or aryloxyl; thio or mercapto, alkyl- or arylthio; amino, alkyl-, aryl-, dialkyl-diaryl-, or arylalkylamino; aminocarbonyl, alkylaminocarbonyl, arylaminocarbonyl, dialkylaminocarbonyl, diarylaminocarbonyl or arylalkylaminocarbonyl; carboxyl, or alkyl- or aryloxycarbonyl; carboxaldehyde, or aryl- or alkylcarbonyl; iminyl, or aryl- or alkyliminyl; sulfo; alkyl- or arylsulfonyl; hydroximinyl, or aryl- or alkoximinyl; carbamido; or thiocarbamido. In addition, two or more alkyl substituents may be combined to form fused heterocycle-alkyl or heterocycle-aryl ring systems. Substituents including heterocyclic groups (e.g., heterocycleoxy, heteroaryloxy, and heteroaralkylthio) are defined by analogy to the above-described terms.

5.1.14 Heterocyclealkyl

The term "heterocyclealkyl" refers to a heterocycle group that is joined to a parent structure by one or more alkyl groups as described above, e.g., 2-piperidylmethyl, and the like. The term "heteroaralkyl" as used herein refers to a heteroaryl group that is joined to a parent structure by one or more alkyl groups as described above, e.g., 2-thienylmethyl, and the like.

5.2 Electroluminescent Devices

In another aspect, the present invention provides electroluminescent devices. In one embodiment, shown in FIG. 3, an organic electroluminescent device comprises first and second electrodes 302, 304 and a single conductive electroluminescent layer 306 that is electroluminescently conductively coupled directly with the first and second electrodes. In a more particular embodiment, electroluminescent layer 306 is comprised of an organic electroluminescent material that includes silicon-oxygen bonds and is described in greater detail in Section 5.3 below. In a more particular embodiment, the first electrode is a cathode and the second electrode is an anode. Electric contacts 308 and 310 can be attached to the electrodes. Finally, the entire device can be driven by an electrical source 312. Another embodiment, shown FIG. 4, comprises first electrode 402, second electrode, 404, a conductive light-emitting layer 406 that is electroluminescently conductively coupled directly with the first and second electrodes. Electric contacts 408 and 410, and an electrical source 412. In this embodiment, a substrate 414 is coupled with electrode 402.

The electrode can be made from any materials known in the electronics and solid state device arts for making electrodes. Such materials can be selected from electrically conductive metals (such as gold (Au), silver (Ag), copper (Cu), aluminum (Al), indium (In), magnesium (Mg), sodium (Na), potassium (K), and the like), or alloys of these electrically conductive metals (such as Mg-Ag, and Mg-In). Useful electrode materials also include conducting oxides (e.g., zinc oxide, stannic oxide, indium oxide, ITO (indium tin oxide), or conducting composite materials (e.g., silver-containing borosilcate glass, silver-containing epoxy resins, silicon rubber, and silver). Still other materials will be familiar to those of skill in the electronics and solid-state device arts. If the first electrode is also to be used as a light-emitting surface, an electrode material such as ITO or gold can be used to increase the transmittance of light emitted from the luminescent layer. Deposition thicknesses of between about 10 nanometers (nm) and about 1000 nm may be used. More specific thicknesses include those between about 50 nm and about 500 nm. Still more specific thicknesses are those between about 100 nm and about 400 nm. Even more specific thicknesses include those between about 200 nm and about 300 nm.

The first electrode may act as the anode or the cathode. In one embodiment, if the first electrode is used as the anode, then the second (opposite) electrode is fabricated from an electrically conductive material having work function larger than the work function of the first electrode. Conversely, if the first electrode is used as the cathode, then the second (opposite) electrode is made from an electrically conductive material having a work function smaller than the work function first electrode. In more specific embodiments, the anode has a work function of at least about 4 electron volts ("eV"); and the cathode material has a work function of less than about 4 eV.

The first electrode can be formed using any of the techniques known in the art of fabricating solid-state electronic devices. Examples of such methods include, but are not limited to, the following. Physical vapor deposition, including resistance heating, electron beam heating, high frequency induction heating, reactive vapor deposition, molecular beam epitaxy, hot wall vapor deposition, ion plating, or ionized cluster beam methods. Sputtering methods, including diode sputtering, diode magnetron sputtering, triode and tetrode plasma sputtering, reactive sputtering, ionized beam sputtering, and combinations of such methods. Casting methods, in which a precursor molecule is dissolved in an appropriate solvent (e.g., chloroform, tetrahydrofuran, benzene, toluene, xylene, or mesitylene) and then cast onto a surface to create a film. The film can be further hardened by placing the device in an oven (under vacuum or a controlled atmosphere) for 10 minutes–24 hours at 30° C.–100° C. Spin casting, in which a suitable amount of a solution as described for casting is dropped onto a surface. The surface is rotated at about 100 revolutions-per-minute ("rpm")–about 20,000 rpm for a period of between about 5 seconds ("s") and about 200 s. The resulting film is then dried as described. These steps can be repeated using different solutions to form a laminate structure. The amounts of materials, solutions, methods for deposition will depend on various factors well-known among those of skill in the solid-state electronic device arts.

The second electrode can be formed using the methods and materials just described with respect to the first electrode. In one embodiment, the second electrode is formed directly on the electroluminescent layer. In one embodiment, the second electrode is effective to prevent substantially any crystallization of the electroluminescent layer such that the layer retains a substantially amorphous structure that reduces any natural quenching of the layer's luminescence during operation of the device.

In some embodiments, a substrate is included. In one embodiment, the substrate comprises a substantially transparent or substantially semi-transparent to allow light created by the organic light emitting material to be emitted from the device. Examples of suitable materials include glass, plastic, quartz, ceramic, and silicon. The choice of materials and methods of fabrication will be familiar among those of skill in the solid-state device and electronics arts.

5.3 Organic Electroluminescent Materials

Figure 3:
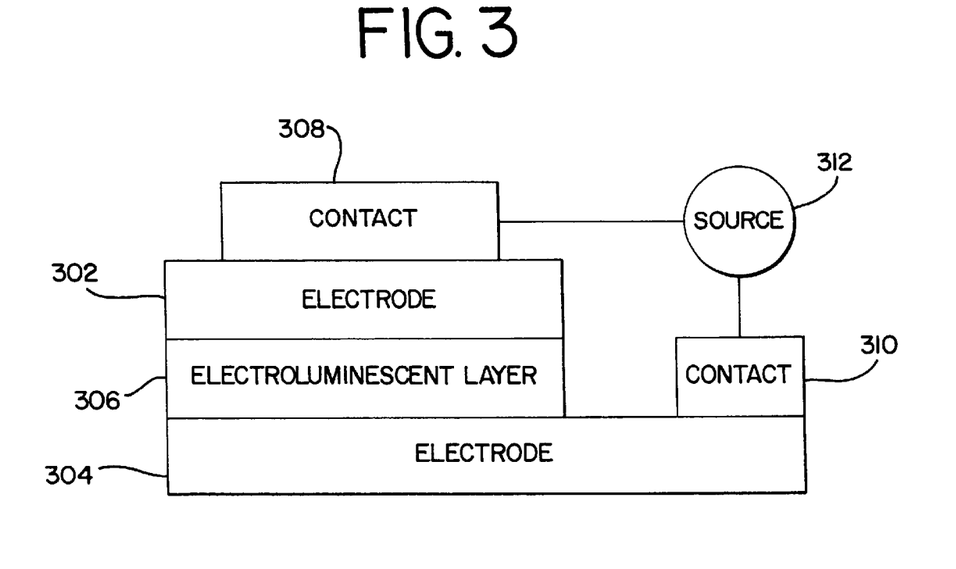
FIG. 3 is a schematic of an electroluminescent device according to a one embodiment of the invention.
Figure 4:
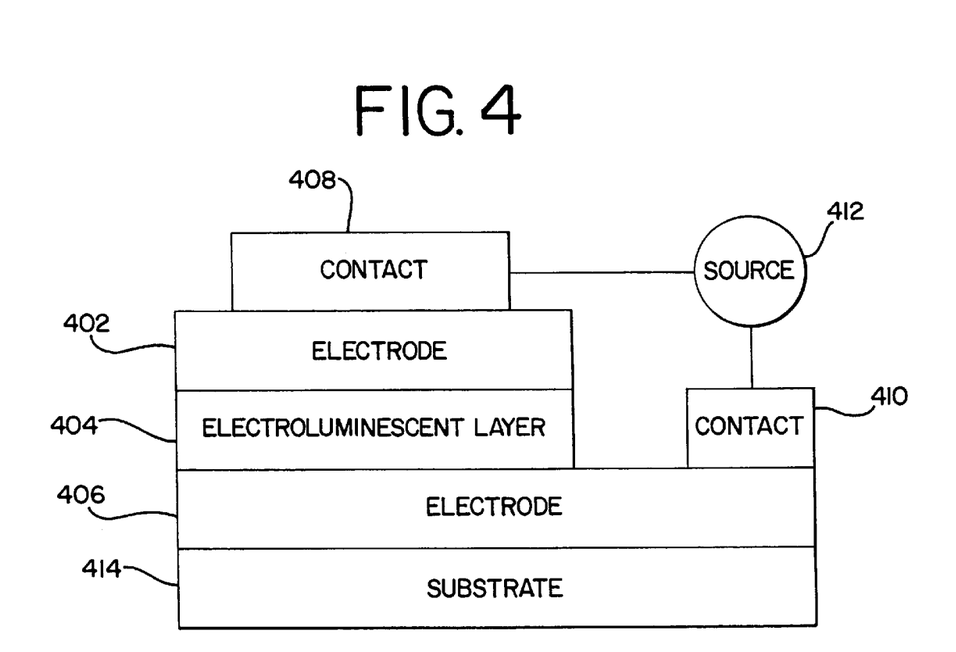
FIG. 4 is a schematic of an electroluminescent device according to a second embodiment of the invention.

The electroluminescent material, such as illustrated at 304 in FIG. 3 and 404 in FIG. 4, comprises, in one embodiment, an organo-siloxane polymer having the basic structure shown below (Compound 1) in which the organic constituents of the organo-siloxane polymer are included in the main chain of the polymer.

Compound 1

In Compound 1, R and R' can be identical or different as described hereinbelow. In one embodiment, R and R' independently are anthracene and pentacene. The anthracene or pentacene component of the organo-siloxane polymer each can be substituted optionally with a substituent selected independently from the group consisting of: hydrogen, alkyl, aryl, heteroalkyl, heteroaralkyl, nitro, cyano, hydroxy, alkoxy, aryloxy, thio, alkythio, arylthio, amino, halogen, dialkylamino, diarylamino, diaralkylamino, arylamino, alkylamino, arylalkylamino, carbonyloxy, carbonylalkoxy, carbonylalkyloxy, alkylcarbonyloxy, arylcarbonyloxy, alkoxylcarbonyloxy, sulfonyl, sulfonyloxy, alkyl bonded to the adjacent silicon atom of the organo-siloxane polymer, aryl bonded to the adjacent silicon atom of the organo-siloxane polymer, or the adjacent silicon atom of said organo-siloxane polymer. One or both of the adjacent silicon atoms of the organo-siloxane polymer must be attached directly to the anthracene or pentacene component of the organo-siloxane polymer, or to one or both of the substituents, depending on the chemical compatibility of the substituent(s) and the silicon atom, such that the anthracene or pentacene is coupled with the main chain of the organo-siloxane polymer. Such compatibility will be recognized by those of skill in the synthetic organic chemical arts.

In one embodiment of Compound 1, the main-chain siloxane polymer includes the anthracene derivative shown as Compound 2 below.

Compound 2

$R_1$–$R_{10}$ are selected independently from the group consisting of hydrogen, alkyl, aryl, heteroalkyl, heteroaralkyl, nitro, cyano, hydroxy, alkoxy, aryloxy, thio, alkythio, arylthio, amino, halogen, dialkylamino, diarylamino, diaralkylamino, arylamino, alkylamino, arylalkylamino, carbonyloxy, carbonylalkoxy, carbonylalkyloxy, alkylcarbonyloxy, arylcarbonyloxy, alkoxylcarbonyloxy, sulfonyl, sulfonyloxy, alkyl bonded to the adjacent silicon atom of the organo-siloxane polymer, aryl bonded to the adjacent silicon atom of the organo-siloxane polymer, or the adjacent silicon atom of said organo-siloxane polymer. The adjacent silicon atoms of the organo-siloxane polymer must be attached directly to the anthracene ring structure and/or one or both of the substituents $R_1$–$R_{10}$, depending on the chemical compatibility of the substituent and the silicon atom, in any combination sufficient to couple Compound 2 to the main chain of the organo-siloxane polymer. Such compatibility will be recognized by those of skill in the synthetic organic chemical arts.

In one particular embodiment, two substituents are coupled with the adjacent silicon atoms of the main chain. In a more particular embodiment, these two substituents are located symmetrically on the anthracene molecule (e.g., $R_1$ and $R_4$, $R_2$ and $R_7$, or $R_5$ and $R_{10}$). In a more particular embodiment, at least one of the substituents is an alkylene group. In a still more particular embodiment, the alkylene group has the general formula —$CH_2(CH_2)_mCH_2$—, where m is an integer between 1 and 4. Still more particularly, m is 1, i.e., the substituent is trimethylene: —$CH_2CH_2CH_2$—.

In yet another particular embodiment, the silicon-coupled substituents are identical. More particular embodiments are those for which the two substituents are $R_5$ and $R_{10}$, where $R_5$=$R_{10}$ and $R_1$–$R_4$ and $R_6$–$R_9$ are chosen from the group listed above with respect to Compound 2. Still more particular embodiments are those embodiments just recited for which $R_5$ and $R_{10}$ are the same alkylene moiety. Yet more particular embodiments are those for which the alkylene moiety is of the general formula —$CH_2(CH_2)_mCH_2$—, and, more particularly, where m is an integer between 1 and 4. One particular embodiment having useful electroluminescent properties is that embodiment for which $R_5$ and $R_{10}$ each are —$CH_2CH_2CH_2$—, and $R_1$–$R_4$ and $R_6$–$R_9$ each are hydrogen. This compound has the structure shown below (Compound 3).

Compound 3

In another embodiment of Compound 1, the main-chain siloxane polymer includes the pentacene derivative shown as Compound 4 below.

Compound 4

$R_{21}$–$R_{34}$ are selected independently from the group consisting of hydrogen, alkyl, aryl, heteroalkyl, heteroaralkyl, nitro, cyano, hydroxy, alkoxy, aryloxy, thio, alkythio, arylthio, amino, halogen, dialkylamino, diarylamino, diaralkylamino, arylamino, alkylamino, arylalkylamino, carbonyloxy, carbonylalkoxy, carbonylalkyloxy, alkylcarbonyloxy, arylcarbonyloxy, alkoxylcarbonyloxy, sulfonyl, sulfonyloxy, alkyl bonded to the adjacent silicon atom of the organo-siloxane polymer, aryl bonded to the adjacent silicon atom of the organo-siloxane polymer, or the adjacent silicon atom of said organo-siloxane polymer. The adjacent silicon atoms of the organo-siloxane polymer must be attached directly to the anthracene ring structure and/or one or both of the substituents $R_{21}$–$R_{34}$, depending on the chemical compatibility of the substituent and the silicon atom, in any combination sufficient to couple Compound 4 to the main chain of the organo-siloxane polymer. Such compatibility will be recognized by those of skill in the synthetic organic chemical arts.

In one particular embodiment, two substituents are coupled with the adjacent silicon atoms of the main chain.

In a more particular embodiment, these two substituents are located symmetrically on the pentacene molecule (e.g., $R_{22}$ and $R_{29}$ or $R_{26}$ and $R_{33}$). In a more particular embodiment, at least one of the substituents is an alkylene group. In a still more particular embodiment, the alkylene group has the general formula —$CH_2(CH_2)_mCH_2$—, where m is an integer between 1 and 4. Still more particularly, m is 1, i.e., the substituent is trimethylene: —$CH_2CH_2CH_2$—.

In yet another particular embodiment, the silicon-coupled substituents are identical. More particular embodiments are those for which the two substituents are $R_{26}$ and $R_{33}$, where $R_{26}=R_{33}$ and $R_{34}-R_{25}$ and $R_{27}-R_{32}$ are chosen from the group listed above with respect to Compound 4. Still more particular embodiments are those embodiments just recited for which $R_{26}$ and $R_{33}$ are the same alkylene moiety. Yet more particular embodiments are those for which the alkylene moiety is of the general formula —$CH_2(CH_2)_mCH_2$—, and, more particularly, where m is an integer between 1 and 4. One particular embodiment having useful electroluminescent properties is that embodiment for which $R_{26}$ and $R_{33}$ each are —$CH_2CH_2CH_2$—, and $R_{34}-R_{25}$ and $R_{27}-R_{32}$ each are hydrogen. This compound has the structure shown below (Compound 5).

Compound 5

The above-described compounds can be made using methods known among those of skill in the art of organic chemistry and materials science arts. In general, the substituents for both Compound 2 and Compound 4 will be chosen to provide desired electronic and mechanical properties. The choice of substituent or combination of substitutents will depend at least in part upon the emission color, electrical, and optical properties required of the intended device. Such choices can be made by considering various well-known chemical properties including, but not limited to, steric factors, electron-withdrawing effects, electron-donating effects, and resonance effects. Often such properties can be estimated, e.g., using chemical modeling software or published parameters. Many such properties can be determined empirically using standard methods and materials.

For example, the organo-siloxane polymer described above (Compound 1) can be formed from anthracene or pentacene optionally substituted as just described and including at least one reactive silyl group that is effective to form siloxane bonds. Examples of such reactive silyl groups include trialkoxysilyl, dialkoxysilyl, trichlorosilyl, dichlorosilyl, heptachlorotrisiloxy, and pentachlorodisiloxy. In more particular embodiments, the present invention provides the following precursors (Compound 6 and Compound 7).

Compound 6

Compound 7

$R_{40}-R_{43}$ and $R_{44}-R_{47}$, and $R_{50}-R_{55}$ and $R_{56}-R_{61}$ are selected independently from the group consisting of hydrogen, alkyl, aryl, heteroalkyl, heteroaralkyl, nitro, cyano, hydroxy, alkoxy, aryloxy, thio, alkythio, arylthio, amino, halogen, dialkylamino, diarylamino, diaralkylamino, arylamino, alkylamino, arylalkylamino, carbonyloxy, carbonylalkoxy, carbonylalkyloxy, alkylcarbonyloxy, arylcarbonyloxy, alkoxylcarbonyloxy, sulfonyl, sulfonyloxy. $R_{48}$, $R_{49}$, $R_{62}$, and $R_{63}$ are selected independently from the group consisting of trialkoxysilyl, dialkoxysilyl, trichlorosilyl, dichlorosilyl, heptachlorotrisiloxy, and pentachlorodisiloxy. In one embodiment, $R_{40}-R_{47}$ and $R_{50}-R_{61}$ are as just described, and $R_{48}$, $R_{49}$, $R_{62}$, and $R_{63}$ each are trichlorosilyl. In a more specific embodiment, $R_{40}-R_{47}$ and $R_{50}-R_{61}$ are each hydrogen and $R_{48}$, $R_{49}$, $R_{62}$, and $R_{63}$ each are trichlorosilyl.

For example, the synthesis of Compound 3 from 9,10-bis(3-trichlorosilylpropyl)anthracene (Compound 6 where $R_{40}-R_{47}$ and $R_{50}-R_{61}$ are each hydrogen, and $R_{48}$, and $R_{49}$ each are trichlorosilyl) is described in section 6.1. The general synthetic route is outlined in FIG. 1 below.

FIG. 1

In step A, commercially-available anthraquinone 1 (Aldrich Chemical Co., Madison Wis.) is reacted with allyl magnesium bromide (CH$_2$CHCH$_2$MgBr, also available commercially from Aldrich) in dry ether to form addition product 2. Product 2 is dehydrated using phenylhydrazine and acetic acid (B). The resulting bis-allylanthracene 3 is reacted with trichlorosilane (HSiCl$_3$) and H$_2$PtCl$_6$.H$_2$O in dry benzene (C) to give the desired final hydrosilation product 4. The pentacene analog can be made using the same synthetic pathway. In general, product 4—the anti-Markovnikov product—is the dominant species. However, it will be appreciated by those of skill in the organic chemistry arts that other alkenes will likely give both Markovnikov as well as anti-Markovnikov hydrosilation products. Nevertheless, both the Markovnikov and anti-Markovnikov addition products can be incorporated into the organo-siloxane polymers of the invention, either in combination or individually after isolation using known methods and materials.

In still other embodiments, the main-chain silicon atoms or the organo-siloxane polymer having the general structure shown above as Compound 1 will be cross-linked with the silicon atoms of other such organo-siloxane polymer chains to form two- and three-dimensional organo-siloxane networks. In more particular embodiments, the cross-links are made by oxygens atom to provide siloxane cross-links. Other cross-links can be formed using atoms or molecules that impart desired mechanical and electronic properties to the matrix, such as, for example, methylene (—CH$_2$—) or oxymethyleneoxy (—O—CH$_2$—O—). Still other cross-linking agents will be familiar to those of skill in the organic chemical and materials science arts.

The electroluminescent material can further be doped with a hole transport material, an electron transport material, an organic or inorganic dye, or a combination of such materials/dyes to alter the color and enhance the light emitting quality of the luminescent organic-inorganic hybrid material. Examples of dopants include porphyrins or aromatic tertiary amines, both of which are known as hole transport agents. Examples of dopants that function as electron transport agents include oxadiazole derivatives such as described in U.S. Pat. No. 5,276,381, which is incorporated reference above, or thiadiazole derivatives, such as disclosed in U.S. Pat. No. 5,336,546, also incorporated by reference above. Examples of suitable dyes include perylene, coumarin, and rhodamine or a rhodamine salt such as rhodamine perchlorate. Again, the choice of materials and their preparation can be accomplished using techniques well known in the organic chemical and materials science arts.

The electroluminescent layer can be formed by standard methods including, but not limited to, physical vapor deposition methods, sputtering, spin-coating, or solution casting. The layer may be formed directly on the first electrode (see Sections 6.3.1 and 6.3.2). In addition, the layer can be doped with a hole transport material, an electron transport material, an organic dye, and/or a combination of the above to enhance it's performance (see Section 6.3.3).

Generally, following deposition, the material is reacted in a humid atmosphere or open air to cure the electroluminescent layer under conditions allowing thermodynamic control of product formation. In one embodiment, the material is exposed to about 100% humidity for about 5 minutes to about 10 minutes and is heated at about 110° C. for about 15 minutes. In another embodiment, the material is exposed to ambient atmospheric moisture prior to heating at 110° C. for about 15 minutes. Still other combinations of reaction conditions will be apparent to those of skill in the organic chemical and materials science arts.

Figure 5A:
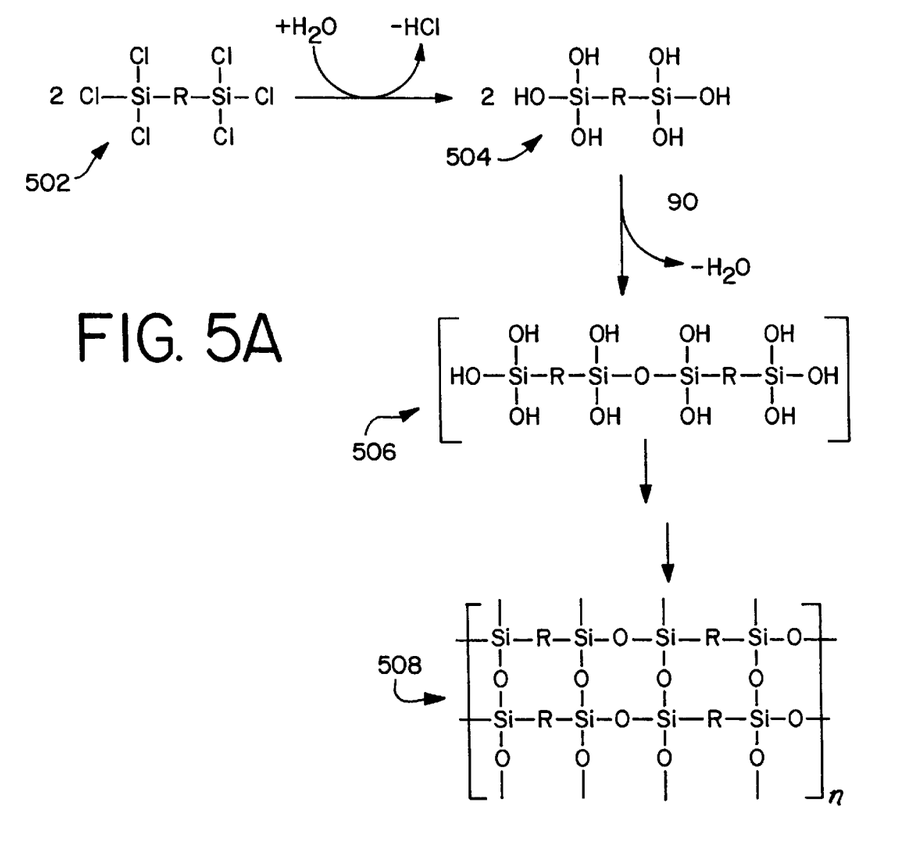
FIG. 5A is a schematic illustration of a proposed chemical reaction mechanism by which the organo-siloxane polymers of the invention are formed.
Figure 5B:
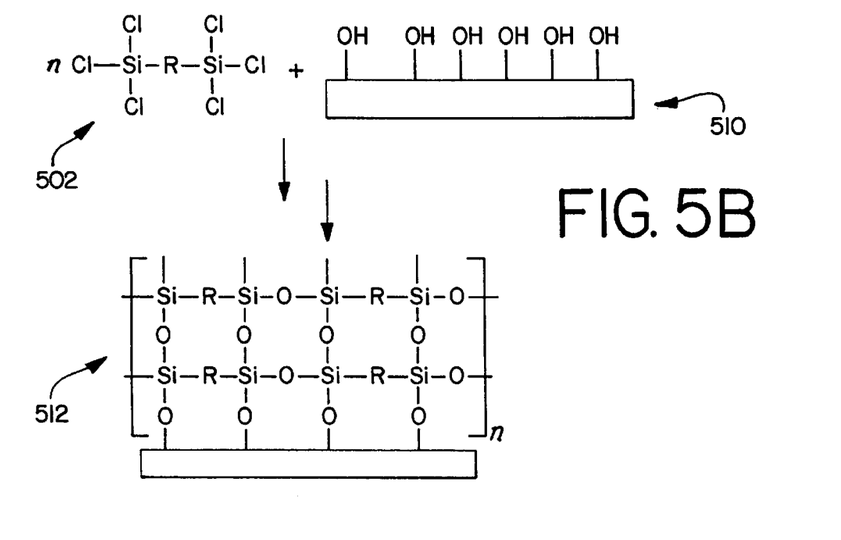
FIG. 5B illustrates a proposed chemical reaction mechanism for the formation of substrate-bound organo-siloxane polymers of the invention.
Figure 6:
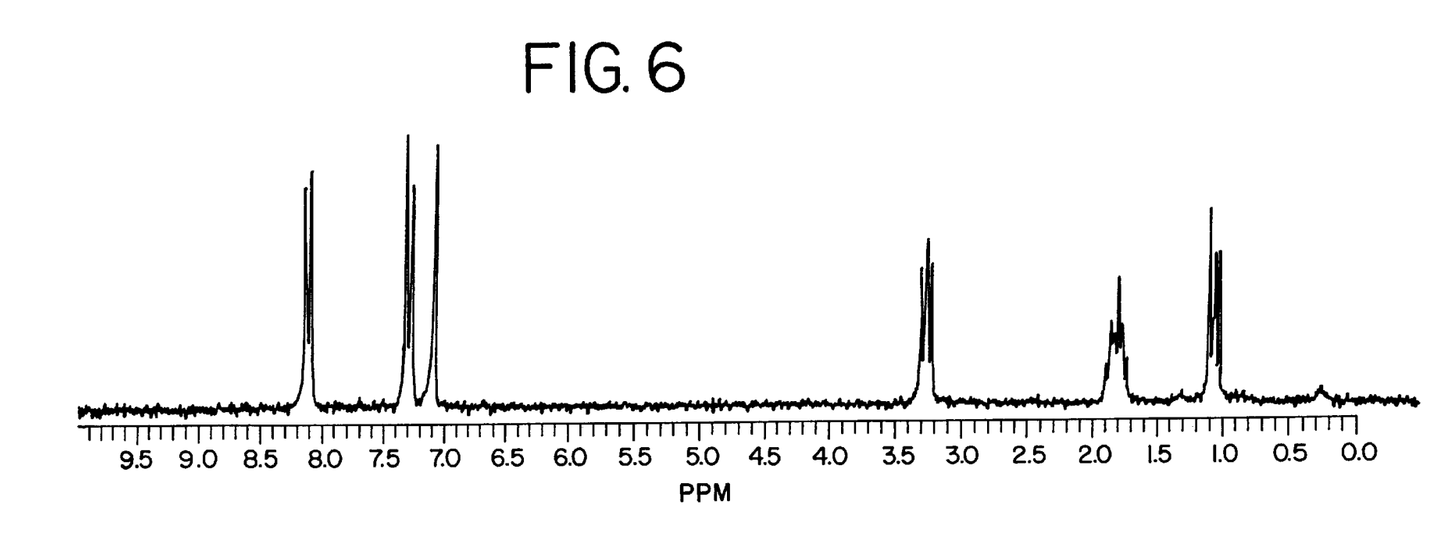
FIG. 6 is the proton nuclear magnetic resonance spectrum ("$^1$H NMR") of 9,10-bisallylanthracene taken at an applied field strength of 200 megahertz (MHz) using a hexadeuterobenzene ($C_6D_6$) standard.

Without wishing to be bound to any particular theory of action, it is believed the chemical reaction of the above-mentioned reactive silyl groups of the organic component of the organo-siloxane polymer (e.g., the above-described trichlorosilyl or trialkoxysilyl groups) with moisture creates an interlocking organic-inorganic hybrid polymeric material comprising silicon-oxygen bonds (e.g., —Si—O—Si—). Generally, water displaces the chloride or alkoxide group to form a hydroxysilane. The hydroxysilane moiety reacts again to displace another chlorine-silicon or alkoxy-silicon bond to form the siloxane network. This reaction sequence is illustrated in FIG. 5A, in which a bis(trichlorosilyl) organic component 502 reacts with water in a first step to form an hydroxysilyl derivative 504. The intermediate reacts with additional trichlorosilyl starting material in a second step to form an organo-siloxane polymer intermediate 506. Thus, those of skill in the organic chemistry arts that the Si—Cl bonds of the starting material 502 do not undergo condensation. Further reaction and cross-linking provides organo-siloxane polymer network 508. Alternatively, as illustrated in FIG. 5B, starting material 502 can be reacted with a hydroxylated surface 510 to form, upon reaction with additional starting material, a substrate-bound organo-siloxane polymer network 512.

6 EXAMPLES

The following Examples are provided to illustrate certain aspects of the present invention and to aid those of skill in the art in the art in practicing the invention. These Examples are in no way to be considered to limit the scope of the invention in any manner.

6.1 Synthesis of Light-Emitting Layer Precursors

6.1.1 9,10-Diallylanthracene

A solution of allylmagnesium bromide was prepared by adding dropwise with vigorous stirring 40 ml of allyl bromide (Aldrich) dissolved in 100 ml of diethyl ether to a mixture of 50 g of magnesium turnings in 300 ml of anhydrous ether. The mixture was stirred for 2 hours following the addition, and the ethereal solution was then transferred to a reaction flask. This flask and transferred solution was cooled to 0° C., and 20 g of anthraquinone (Aldrich) was added in 500 mg portions.

The anthraquinone/allyl magnesium bromide solution was stirred for 14 h and then warmed slowly to room temperature. The temperature of the reaction mixture was reduced to 0° C., and then ice was added to the mixture until a yellow ether solution was formed. This solution was separated from the rest of the reaction mixture and reduced in vacuo until a white precipitate formed. The precipitate was washed with petroleum ether and dried in vacuo. The solid was mixed with 6 ml of phenylhydrazine and 26 ml of glacial acetic acid and then was heated at 40° C. for 2 hours, refluxed for 30 minutes, and then cooled to room temperature over a period of 12 hours. A yellow powder precipitated from the reaction mixture. The powder was recrystallized from acetic acid and ethanol. Characterization: Elemental Analysis (Theory (Found)): C:93.02 (92.75), H: 6.98 (7.10).

6.1.2 9,10-Bis(trichlorosilylpropyl)anthracene 1 g of 9,10-Diallylanthracene (prepared as described in Section 6.1.1 above) was dissolved in 20 ml of dry toluene. A single crystal of hydrogen hexachloroplatinum was added to the solution, followed by 1 ml of trichlorosilane. The mixture was stirred at 40° C. for 9 hours after which time the volatile components were removed in vacuo. The remaining solid was sublimed, yielding a yellow solid having the following mass spectrographic characteristic: MS (M+): 578. $^1$H NMR (200 MHz, $C_6D_6$): 8.12 (dd, 4 H, J=10.4Hz); 7.34 (dd, 4 H, J=10.1 Hz); 3.34 (t, 4 H, J≈8.14 Hz); 1.85 (tt, 4 H, J=8.14 Hz); 1.09 (t, 4 H, 8.3 Hz).

6.2 Preparation of the Device Substrate

A sheet of indium-tin oxide-coated glass (7"×7", Donnally) was cut into 1"×1" squares. Each of the squares was sonicated for 10 minutes in successive baths of acetone, methanol, and reverse osmosis de-ionized water. The squares were then dried at 110° C. for 12 hours prior to use.

6.3 Device Construction

6.3.1 Devices of Structure 1

A surface layer of 9,10-bis(trichlorosilylpropyl) anthracene having a thickness of about 100 nm was deposited onto a clean ITO substrate (see Section 6.2) by resistive heating at a rate of about 0.2 nm/sec at a pressure of about $10^{-6}$ Torr. The anthracene layer was then exposed to ambient atmosphere for about 15 minutes and then heated to 110° C. for about 30 minutes. A 300 nm layer of magnesium metal (Cerac) was deposited over the bis(trichlorosilylpropyl) anthracene layer by resistive heating at a rate of about 0.5 nm/sec at a pressure of about $10^{-6}$ Torr. A pale violet emission having an approximate intensity of 100 cd/m$^2$ emanated from the device upon application of 12 V of direct current (DC).

6.3.2 Devices of Structure 2

An anhydrous solution of 9,10-bis(trichlorosilylpropyl) anthracene in xylene (1% by weight) was spun-cast onto a clean ITO substrate (prepared as described in Section 6.2) at 2,000 revolutions-per-minute ("rpm") for 60 seconds ("s"). The coated substrate was placed in a humidity chamber have an ambient humidity of 100% and a temperature of 25° C. for 15 minutes ("min"). The device was then heated to 110° C. for about 0.5 hours ("hrs.") A layer of magnesium metal (Cerac) was deposited by resistive heating over the bis (trichlorosilylpropyl)anthracene layer to a thickness of about 300 nm at a rate of about 0.5 nm/s and a pressure of about $10^{-6}$ Torr. A pale violet emission having an intensity of about 100 cd/m$^2$ was observed upon the application of a 12 V DC current to the device.

6.3.3 Devices of Structure 3

An anhydrous solution of 9,10-bis(trichlorosilylpropyl) anthracene in xylene (1% by weight) and tetraphenylporphyrin (0.1% by weight) was spun-cast onto a clean ITO substrate (prepared as described in Section 6.2) at 4,000 rpm for 30 s. The coated substrate was place in a humidity chamber have an ambient humidity of 100% and a temperature of 25° C. for 15 min. The device was then heated to 110° C. for about 0.5 hrs. A layer of magnesium metal (Cerac) was deposited by resistive heating over the bis (trichlorosilylpropyl)anthracene/tetraphenylporphyrin layer to a thickness of about 300 nm at a rate of about 0.5 nm/s and a pressure of about $10^{-6}$ Torr. A pale violet emission having an intensity of about 100 cd/m$^2$ was observed upon the application of a 8 V DC current to the device.

6.3.4 Devices of Structure 4

An anhydrous solution of 9,10-bis(trichlorosilylpropyl) anthracene in xylene (1% by weight) and coumarin 6 (1% by weight) was spun-cast onto a clean ITO substrate (prepared as described in Section 6.2) at 4,000 rpm for 30 s. The coated substrate was place in a humidity chamber have an ambient humidity of 100% and a temperature of 25° C. for 5 min. The device was then heated to 110° C. for about 1 hour. A layer of magnesium metal (Cerac) was deposited by resistive heating over the bis(trichlorosilylpropyl)anthracene/ coumarin 6 layer to a thickness of about 150 nm at a rate of about 2 nm/s and a pressure of about $10^{-6}$ Torr. A green emission having an intensity of about 100 cd/m$^2$ was observed upon the application of a 5 V DC current to the device.

6.3.5 Devices of Structure 5

An anhydrous solution of 9,10-bis(trichlorosilylpropyl) anthracene in tetrahydrofuran (1% by weight) and rhodamine perchlorate (1% by weight) was spun-cast onto a clean ITO substrate (prepared as described in Section 6.2) at 4,000 rpm for 30 s. The coated substrate was place in a humidity chamber have an ambient humidity of 100% and a temperature of 25° C. for 5 min. The device was then heated to 110° C. for about 1 hour. A layer of magnesium metal (Cerac) was deposited by resistive heating over the bis (trichlorosilylpropyl)anthracene/rhodamine layer to a thickness of about 150 nm at a rate of about 2 nm/s and a pressure of about $10^{-6}$ Torr. A red emission having an intensity of about 30 cd/m$^2$ was observed upon the application of a 5 V DC current to the device.

6.3.6 Devices of Structure 6

An anhydrous solution of 9,10-bis(trichlorosilylpropyl) anthracene in xylene (1% by weight) and perylene (1% by weight) was spun-cast onto a clean ITO substrate (prepared as described in Section 6.2) at 4,000 rpm for 30 s. The coated substrate was place in a humidity chamber have an ambient humidity of 100% and a temperature of 25° C. for 5 min. The device was then heated to 110° C. for about 1 hour. A layer of magnesium metal (Cerac) was deposited by resistive heating over the bis(trichlorosilylpropyl)anthracene/perylene layer to a thickness of about 150 nm at a rate of about 2 nm/s and a pressure of about $10^{-6}$ Torr. A green emission having an intensity of about 30 cd/m$^2$ was observed upon the application of a 5 V DC current to the device.

Thus, the present invention will be seen to provide a light-weight, durable, efficient electroluminescent device. Such devices can be used in a wide variety of applications in consumer and military electronics, such as computers and visual display terminals.

Although certain embodiments and examples have been used to describe the present invention, it will be apparent to those having skill in the art that various changes can be made to those embodiment and/or examples without departing from the scope or spirit of the present invention. For example, other substituents having similar electronic and steric properties can be used in addition to those exemplified herein without departing from the scope of the invention. A wide variety of processing techniques can be used to provide the cross-linked siloxane network provided by the present invention.

What is claimed:

1. An electroluminescent device, comprising:
   an anode;
   a cathode; and
   an organic electroluminescent material including a dopant, and an organo-siloxane polymer, the main chain of said organo-siloxane polymer having an organic component selected from the group consisting of anthracene and pentacene, either individually or in combination, each of said anthracene and pentacene being either:
      substituted optionally with hydrogen, alkyl, aryl, heteroalkyl, heteroaralkyl, nitro, cyano, hydroxy, alkoxy, aryloxy, thio, alkylthio, arylthio, amino, halogen, dialkylamino, diarylamino, diaralkylamino, arylamino, alkylamino, arylalkylamino, carbonyloxy, carbonylalkoxy, carbonylalkyloxy, alkylcarbonyloxy, arylcarbonyloxy, alkoxylcarbonyloxy, sulfonyl, sulfonyloxy;
      alkyl bonded to an adjacent silicon atom of the organo-siloxane polymer;
      aryl bonded to an adjacent silicon atom of the organo-siloxane polymer; or,
      bonded to an adjacent silicon atom of said organo-siloxane polymer;
   said organic electroluminescent material being electroluminescently conductively coupled directly with said cathode and said anode such that said organic electroluminescent material emits light upon the application of a voltage across said cathode and said anode.

2. The electroluminescent device of claim 1, wherein said organic component comprises anthracene.

3. The electroluminescent device of claim 2, wherein said anthracene is coupled with a silicon atom in said main chain by at least one alkyl group.

4. The electroluminescent device of claim 3, wherein said alkyl group has the formula —CH$_2$(CH$_2$)$_m$CH$_2$—, where m is an integer between 1 and 4.

5. The electroluminescent device of claim 4, wherein anthracene is coupled with two silicon atoms in said main chain by two of said alkyl groups.

6. The electroluminescent device of claim 5, wherein m is 1 and said alkyl groups are placed at symmetric positions on said anthracene.

7. The electroluminescent device of claim 6, wherein said anthracene has the formula:

8. The electroluminescent device of claim 1, wherein said organic component comprises pentacene.

9. The electroluminescent device of claim 8, wherein said pentacene is coupled with a silicon atom in said main chain by at least one alkyl group.

10. The electroluminescent device of claim 9, wherein said alkyl group has the formula —CH$_2$(CH$_2$)$_m$CH$_2$—, where m is an integer between 1 and 4.

11. The electroluminescent device of claim 10, wherein said pentacene is coupled with two silicon atoms in said main chain by two of said alkyl groups.

12. The electroluminescent device of claim 11, wherein m is 1 and said alkyl groups are placed at symmetric positions on said pentacene.

13. The electroluminescent device of claim 12, wherein said pentacene has the formula:

14. The electroluminescent device of claim 8, further comprising a substrate coupled to one of said cathode and said anode.

15. The electroluminescent device of claim 1, wherein said dopant is selected from the group consisting of hole transport materials, electron transport materials, and dyes.

16. The electroluminescent device of claim 15, wherein said dopant is a hole transport material.

17. The electroluminescent device of claim 16, wherein said hole transport material is a porphyrin or an aromatic tertiary amine.

18. The electroluminescent material of claim 15, wherein said dopant is a dye.

19. The electroluminescent material of claim 18, wherein said dye is selected from the group consisting of coumarin, rhodamine perchlorate, and perylene.

20. The electroluminescent device of claim 1, further comprising a substrate coupled to one of said cathode and said anode.

21. The electroluminescent device of claim 1, wherein said organo-siloxane polymer is cross-linked by oxygen atoms to provide an organo-siloxane network.

22. An organic electroluminescent material, comprising
an organo-siloxane polymer first component, the main chain of said organo-siloxane polymer having an organic component selected from the group consisting of anthracene and pentacene, either individually or in combination, each of said anthracene and pentacene being either:
substituted optionally with hydrogen, alkyl, aryl, heteroalkyl, heteroaralkyl, nitro, cyano, hydroxy, alkoxy, aryloxy, thio, alkylthio, arylthio, amino, halogen, dialkylamino, diarylamino, diaralkylamino, arylamino, alkylamino, arylalkylamino, carbonyloxy, carbonylalkoxy, carbonylalkyloxy, alkylcarbonyloxy, arylcarbonyloxy, alkoxylcarbonyloxy, sulfonyl, sulfonyloxy;
alkyl bonded to an adjacent silicon atom of the organo-siloxane polymer;
aryl bonded to an adjacent silicon atom of the organo-siloxane polymer; or,
bonded to an adjacent silicon atom of said organo-siloxane polymer; and
a second component;
such that said electroluminescent material emits light upon the application of a voltage when said electroluminescent material is electroluminescently conductively coupled directly with a cathode and an anode.

23. The organic electroluminescent material of claim 22, wherein said organic component comprises anthracene.

24. The organic electroluminescent material of claim 23, wherein said anthracene is coupled with a silicon atom in said main chain by at least one alkyl group.

25. The organic electroluminescent material of claim 24, wherein said alkyl group has the formula —CH$_2$(CH$_2$)$_m$CH$_2$—, where m is an integer between 1 and 4.

26. The organic electroluminescent material of claim 25, wherein anthracene is coupled with two silicon atoms in said main chain by two of said alkyl groups.

27. The organic electroluminescent material of claim 26, wherein m is 1 and said alkyl groups are placed at symmetric positions on said anthracene.

28. The organic electroluminescent material of claim 27, wherein said anthracene has the formula:

29. The organic electroluminescent material of claim 22, wherein said organic component comprises pentacene.

30. The organic electroluminescent material of claim 29, wherein said pentacene is coupled with a silicon atom in said main chain by at least one alkyl group.

31. The organic electroluminescent material of claim 30, wherein said alkyl group has the formula —CH$_2$(CH$_2$)$_m$CH$_2$—, where m is an integer between 1 and 4.

32. The organic electroluminescent material of claim 31, wherein said pentacene is coupled with two silicon atoms in said main chain by two of said alkyl groups.

33. The organic electroluminescent material of claim 32, wherein m is 1 and said alkyl groups are placed at symmetric positions on said pentacene.

34. The organic electroluminescent material of claim 33, wherein said pentacene has the formula:

35. The organic electroluminescent material of claim 22, wherein said second component comprises a porphyrin or an aromatic tertiary amine.

36. The organic electroluminescent material of claim 22, wherein said second component comprises a dye.

37. The organic electroluminescent material of claim 36, wherein said dye is selected from the group consisting of coumarin, rhodamine perchlorate, and perylene.

38. An electroluminescent material and substrate combination comprising an organic electroluminescent material as described in claim 22 coupled to a substrate.

39. The organic electroluminescent material of claim 22, wherein said organo-siloxane polymer is cross-linked by oxygen atoms to provide an organo-siloxane network.

40. An organo-siloxane polymer comprising a main chain including silicon and oxygen, and an organic component comprising anthracene coupled with a silicon atom in said main chain by at least one alkyl group having the formula —$CH_2(CH_2)_mCH_2$—, where m is an integer between 1 and 4.

41. An organo-siloxane polymer of claim 40, wherein anthracene is coupled with two silicon atoms in said main chain by two of said alkyl groups.

42. An organo-siloxane polymer of claim 41, wherein m is 1 and said alkyl groups are placed at symmetric positions on said anthracene.

43. An organo-siloxane polymer of claim 42, wherein said anthracene has the formula:

44. An organo-siloxane polymer comprising a main chain including silicon and oxygen, and an organic component comprising pentacene, said pentacene being either:

substituted optionally with hydrogen, alkyl, aryl, heteroalkyl, heteroaralkyl, nitro, cyano, hydroxy, alkoxy, aryloxy, thio, alkylthio, arylthio, amino, halogen, dialkylamino, diarylamino, diaralkylamino, arylamino, alkylamino, arylalkylamino, carbonyloxy, carbonylalkoxy, carbonylalkyloxy, alkylcarbonyloxy, arylcarbonyloxy, alkoxylcarbonyloxy, sulfonyl, sulfonyloxy;

alkyl bonded to an adjacent silicon atom of the organo-siloxane polymer;

aryl bonded to an adjacent silicon atom of the organo-siloxane polymer; or, bonded to an adjacent silicon atom of said organo-siloxane polymer wherein the polymer is electroluminescent.

45. An organo-siloxane polymer of claim 44, wherein said pentacene is coupled with a silicon atom in said main chain by at least one alkyl group.

46. An organo-siloxane polymer of claim 45, wherein said alkyl group has the formula —$CH_2(CH_2)_mCH_2$—, where m is an integer between 1 and 4.

47. An organo-siloxane polymer of claim 46, wherein said pentacene is coupled with two silicon atoms in said main chain by two of said alkyl groups.

48. An organo-siloxane polymer of claim 47, wherein m is 1 and said alkyl groups are placed at symmetric positions on said pentacene.

49. An organo-siloxane polymer of claim 48, wherein said pentacene has the formula:

* * * * *